US011293991B2

(12) United States Patent
Jang et al.

(10) Patent No.: US 11,293,991 B2
(45) Date of Patent: Apr. 5, 2022

(54) APPARATUS FOR MEASURING INSULATION RESISTANCE

(71) Applicant: SK INNOVATION CO., LTD., Seoul (KR)

(72) Inventors: Ho Sang Jang, Daejeon (KR); Seon Yong Kim, Daejeon (KR); Byoung Kyu Park, Daejeon (KR); Yong Sug Choi, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 52 days.

(21) Appl. No.: 16/815,777

(22) Filed: Mar. 11, 2020

(65) Prior Publication Data

US 2020/0292623 A1 Sep. 17, 2020

(30) Foreign Application Priority Data

Mar. 15, 2019 (KR) .................. 10-2019-0029760

(51) Int. Cl.
*G01R 31/385* (2019.01)
*G01R 27/18* (2006.01)
*G01R 31/12* (2020.01)

(52) U.S. Cl.
CPC ........... *G01R 31/385* (2019.01); *G01R 27/18* (2013.01); *G01R 31/1227* (2013.01)

(58) Field of Classification Search
CPC ............... G01R 31/385; G01R 31/382; G01R 31/1227; G01R 27/18
See application file for complete search history.

(56) References Cited

U.S. PATENT DOCUMENTS

| 2011/0006777 A1* | 1/2011 | Park | B60L 3/0046 324/509 |
| 2012/0016613 A1* | 1/2012 | Yang | G01R 27/08 702/65 |
| 2013/0176041 A1* | 7/2013 | Yang | G01R 27/025 324/691 |
| 2013/0176042 A1* | 7/2013 | Huh | G01N 27/04 324/693 |

(Continued)

FOREIGN PATENT DOCUMENTS

DE         10304234 A1 *  8/2004  ............ G01R 31/52
KR   10-2013-0059107 A    6/2013

*Primary Examiner* — Patrick Assouad
*Assistant Examiner* — Demetrius R Pretlow
(74) *Attorney, Agent, or Firm* — IP & T Group LLP

(57) ABSTRACT

An apparatus for measuring an insulation resistance according to the present invention includes: a first distribution resistor connected to a positive terminal of a battery and a ground; a first switch connected to the positive terminal of the battery and the first distribution resistor; a second distribution resistor connected to a negative terminal of the battery and the ground; a second switch connected to the negative terminal the battery and the second distribution resistor; and an insulation resistance measurement unit measuring a resistance value of a negative electrode insulation resistor of the battery using a first voltage applied to the first distribution resistor and measuring a resistance value of a positive electrode insulation resistor of the battery using a second voltage applied to the second distribution resistor.

8 Claims, 3 Drawing Sheets

(56) References Cited

U.S. PATENT DOCUMENTS

| | | | |
|---|---|---|---|
| 2014/0021961 A1* | 1/2014 | Yamada | G01R 31/52 324/503 |
| 2014/0095093 A1* | 4/2014 | Hong | G01R 31/52 702/63 |
| 2016/0252587 A1* | 9/2016 | Kawanaka | G01R 27/025 324/549 |
| 2017/0297447 A1* | 10/2017 | Tzivanopoulos | H02J 7/00 |
| 2017/0328940 A1* | 11/2017 | Choi | G01R 27/18 |
| 2018/0224493 A1* | 8/2018 | Kawamura | G01R 31/52 |
| 2019/0310300 A1* | 10/2019 | Kawamura | G01R 31/086 |
| 2020/0064410 A1* | 2/2020 | Tong | G01R 27/02 |
| 2020/0144812 A1* | 5/2020 | Shin | G01R 31/52 |
| 2020/0217893 A1* | 7/2020 | Song | G01R 15/04 |

* cited by examiner

APPARATUS FOR MEASURING INSULATION RESISTANCE

CROSS-REFERENCE TO RELATED APPLICATIONS

This application claims priority under 35 U.S.C. § 119 to Korean Patent Application No. 10-2019-0029760, filed on Mar. 15, 2019, in the Korean Intellectual Property Office, the disclosure of which is incorporated herein by reference in its entirety.

TECHNICAL FIELD

The following disclosure relates to an apparatus for measuring an insulation resistance having simple configuration for measuring an insulation resistance of a battery and improving insulation resistance measurement rate.

BACKGROUND

In an electric vehicle or a hybrid vehicle using a high-voltage battery, an insulation resistance of the battery is very important because the insulation resistance indicates that a ground fault has occurred. A positive electrode insulation resistor between a positive terminal of the battery and a ground (e.g., a chassis ground of a vehicle) and a negative electrode insulation resistor between a negative terminal of the battery and the ground have infinite resistance values when no ground fault occurs, but have small resistance values when a ground fault occurs.

The insulation resistance of the battery is measured by using a voltage applied to a distribution resistor after forming a current path that is connected to the positive terminal of the battery, the ground, and the negative terminal of the battery.

In a conventional apparatus for measuring an insulation resistance, an operational amplifier is provided to measure a voltage applied to a distribution resistor and a test circuit is provided to test the performance of operational amplifier. When the operational amplifier and the test circuit are provided in the apparatus for measuring an insulation resistance, this results in increases in the complexity and the price of the apparatus, and a decrease in an insulation resistance measurement rate. In a conventional apparatus for measuring an insulation resistance, only a distribution resistor is connected to the ground. In this case, a switch is not protected from an external surge, thereby shortening the lifespan of the apparatus.

Related Art Document

Patent Document

KR 2013-0059107A (Jun. 5, 2013)

SUMMARY

An embodiment of the present invention is directed to providing an apparatus for measuring an insulation resistance improving insulation resistance measurement rate, while the complexity and the price of the apparatus are reduced.

Another embodiment of the present invention is directed to providing an apparatus for measuring an insulation resistance capable of protecting a switch from an external surge, so that the lifespan of the apparatus can be extended.

In one general aspect, an apparatus for measuring an insulation resistance includes: a first distribution resistor connected to a positive terminal of a battery and a ground; a first switch connected to the positive terminal of the battery and the first distribution resistor; a second distribution resistor connected to a negative terminal of the battery and the ground; a second switch connected to the negative terminal of the battery and the second distribution resistor; and an insulation resistance measurement unit measuring a resistance value of a negative electrode insulation resistor of the battery using a first voltage applied to the first distribution resistor and measuring a resistance value of a positive electrode insulation resistor of the battery using a second voltage applied to the second distribution resistor.

The insulation resistance measurement unit may be connected directly to the first distribution resistor and the second distribution resistor to measure the first voltage and the second voltage.

The insulation resistance measurement unit may control the first switch and the second switch to be turned on or off to create a current path connected to the positive terminal of the battery, the ground, and the negative terminal of the battery.

When the resistance value of the positive electrode insulation resistor of the battery is measured, the insulation resistance measurement unit may operate the first switch in a turn-off state and the second switch in a turn-on state. When the resistance value of the negative electrode insulation resistor of the battery is measured, the insulation resistance measurement unit may operate the first switch in a turn-on state and the second switch in a turn-off state.

When the resistance value of the positive electrode insulation resistor of the battery is measured, the insulation resistance measurement unit may assume the negative electrode insulation resistor of the battery to have an infinite resistance value. When the resistance value of the negative electrode insulation resistor of the battery is measured, the insulation resistance measurement unit may assume the positive electrode insulation resistor of the battery to have an infinite resistance value.

The apparatus for measuring an insulation resistance may further include: a first protective resistor connected to the positive terminal of the battery and the first switch; and a second protective resistor connected to the negative terminal of the battery and the second switch.

The apparatus for measuring an insulation resistance may further include a direct current voltage source connected to the second distribution resistor and the ground.

The insulation resistance measurement unit may measure the resistance value of the positive electrode insulation resistor of the battery through the following Equation 1.

$$Riso1 = \left(\frac{Vb - Vdc}{V2}\right)R2 - (R2 + Ron2) \quad \text{[Equation 1]}$$

(where Riso1 is the resistance value of the positive electrode insulation resistor of the battery, Vb is a voltage of the battery, Vdc is a voltage of the direct current voltage source, V2 is the second voltage applied to the second distribution resistor, R2 is a resistance value of the second distribution resistor, and Ron2 is a resistance value of the second protective resistor).

The insulation resistance measurement unit may measure the resistance value of the negative electrode insulation resistor of the battery through the following Equation 2.

$$Riso2 = \left(\frac{Vb}{V1}\right)R1 - (R2 + Ron1) \qquad \text{[Equation 2]}$$

(where Riso2 is the resistance value of the negative electrode insulation resistor of the battery, Vb is a voltage of the battery, V1 is the first voltage applied to the first distribution resistor, R1 is a resistance value of the first distribution resistor, and Ron1 is a resistance value of the first protective resistor).

DETAILED DESCRIPTION OF MAIN ELEMENTS

Figure 1:
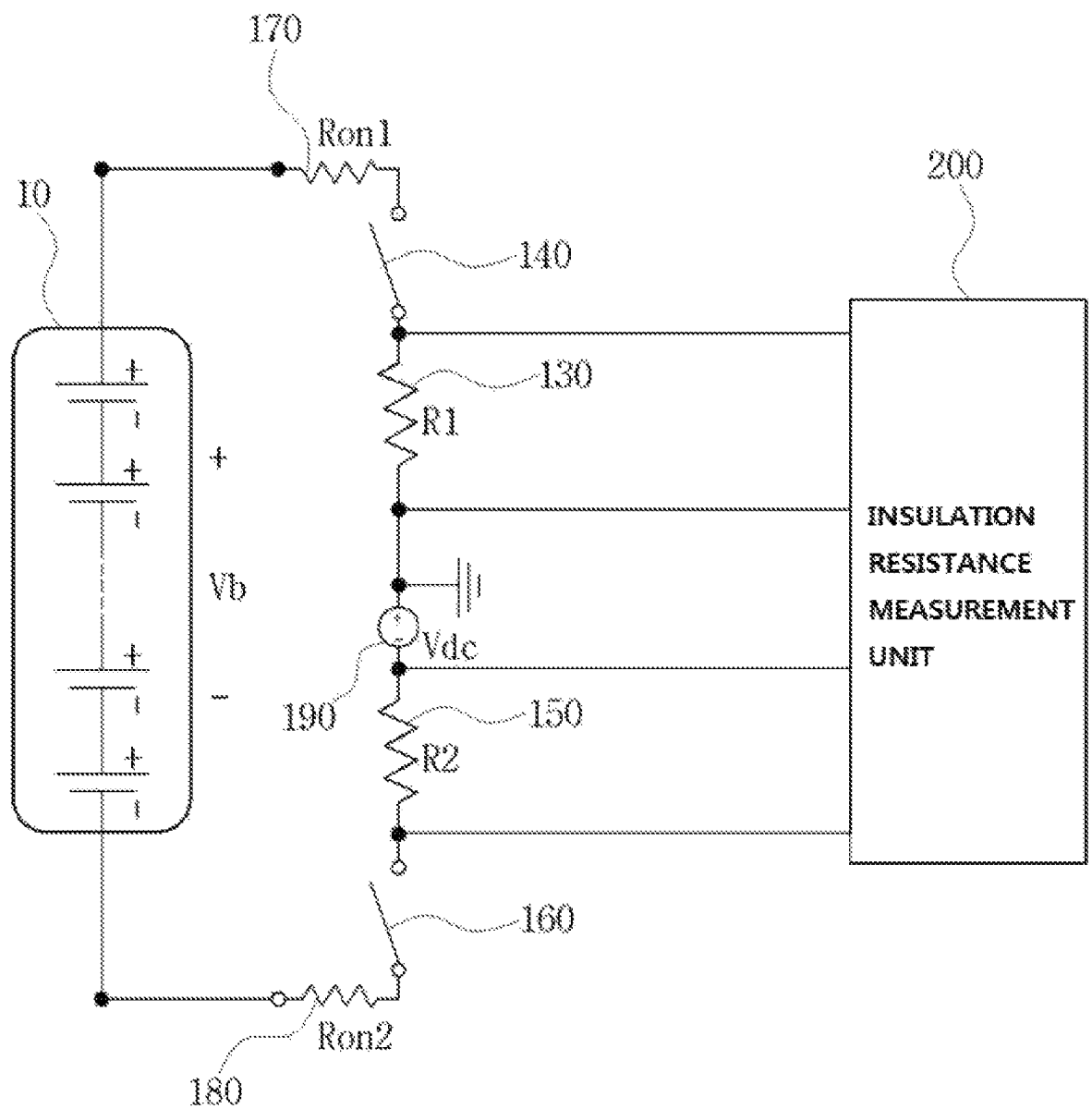
FIG. 1 is a diagram schematically illustrating an apparatus for measuring an insulation resistance according to an exemplary embodiment of the present invention.

10: Battery
110: Positive electrode insulation resistor
120: Negative electrode insulation resistor
130: First distribution resistor
140: First switch
150: Second distribution resistor
160: Second switch
170: First protective resistor
180: Second protective resistor
190: Direct current voltage source
200: Insulation resistance measurement unit

DETAILED DESCRIPTION OF EMBODIMENTS

Hereinafter, an apparatus for measuring an insulation resistance according to the present invention will be described in detail with reference to the accompanying drawings. The accompanying drawings are provided merely for illustrative purposes so as to sufficiently transfer the spirit of the present invention to those skilled in the art, and the present invention is not limited to the accompanying drawings set forth below, but may be implemented in other forms.

FIG. 1 is a diagram schematically illustrating an apparatus for measuring an insulation resistance according to an exemplary embodiment of the present invention.

The apparatus for measuring an insulation resistance according to an exemplary embodiment of the present invention includes a first distribution resistor 130, a first switch 140, a second distribution resistor 150, a second switch 160, and an insulation resistance measurement unit 200.

The first distribution resistor 130 is connected to a positive terminal of a battery 10 and a ground, and the first switch 140 is connected to the positive terminal of the battery 10 and the first distribution resistor 130. The second distribution resistor 150 is connected to a negative terminal of the battery 10 and the ground, and the second switch 160 is connected to the negative terminal of the battery 10 and the second distribution resistor 150. Here, the battery 10 may include a plurality of battery cells connected in series or in parallel.

The insulation resistance measurement unit 200 is connected directly to the first distribution resistor 130 and the second distribution resistor 150 to measure a first voltage applied to the first distribution resistor 130 and a second voltage applied to the second distribution resistor 150. Here, the direct connections of the insulation resistance measurement unit 200 to the first distribution resistor 130 and to the second distribution resistor 150 means connections between the insulation resistance measurement unit 200 and the first distribution resistor 130 and between the insulation resistance measurement unit 200 and the second distribution resistor 150 without any intervening components.

In a conventional apparatus for measuring an insulation resistance, an operational amplifier and a test circuit for testing the performance of the operational amplifier are provided between an insulation resistance measurement unit and a distribution resistor. However, when the operational amplifier or the test circuit is provided in the apparatus for measuring an insulation resistance, this results in increases in the complexity and the price of the apparatus, and an insulation resistance measurement rate decreases because it is required to add a process of processing a voltage that is amplified by the operational amplifier to the insulation resistance measurement unit. In contrast, the present invention is capable of not only decreasing the complexity and the price of the apparatus for measuring an insulation resistance but also improving the insulation resistance measurement rate by connecting the insulation resistance measurement unit 200 directly to the first distribution resistor 130 and the second distribution resistor 150 while excluding an intervening component such as an operational amplifier or a test circuit.

Figure 2:
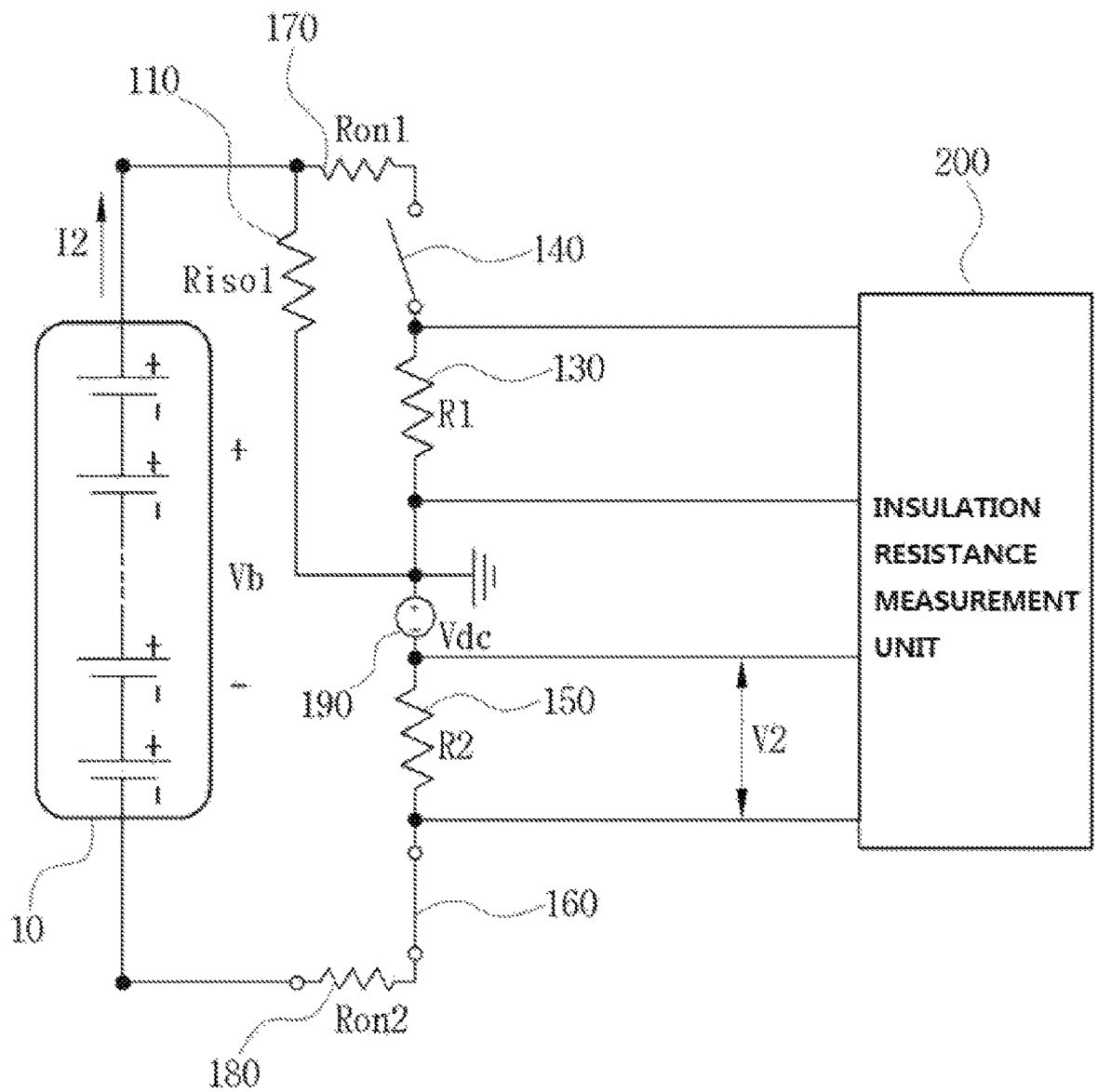
FIG. 2 is a diagram schematically illustrating a case in which a dielectric breakdown occurs at a positive electrode of the battery in FIG. 1.

Meanwhile, the insulation resistance measurement unit 200 measures a resistance value of a negative electrode insulation resistor 120 of the battery 10 using the first voltage applied to the first distribution resistor 130, and measures a resistance value of a positive electrode insulation resistor 110 of the battery 10 using the second voltage applied to the second distribution resistor 150, as will be described below. Here, the second voltage measured by the insulation resistance measurement unit 200 may refer only to a voltage applied to the second distribution resistor 150 as illustrated in FIG. 2, but may optionally refer to a voltage applied between one end of the second distribution resistor 150 (that is, a point between the second distribution resistor 150 and the second switch 160) and the ground.

In order for the insulation resistance measurement unit 200 to measure the resistance values of the positive electrode insulation resistor 110 and the negative electrode insulation resistor 120 of the battery 10, it is required to create a current path connected to the positive terminal of the battery 10, the ground, and the negative terminal of the battery 10. To do this, the insulation resistance measurement unit 200 also serves to control the first switch 140 and the second switch 160 to be turned on or off so as to create a current path.

In order to measure voltages applied to the distribution resistors 130 and 150, measure insulation resistances of the battery 10 using the measured voltages, and control the switches 140 and 160 to create a current path, the insulation resistance measurement unit 200 includes a micro controller unit (MCU).

According to FIG. 1, the first distribution resistor 130 is located between the first switch 140 and the ground, and the second distribution resistor 150 is located between the second switch 160 and the ground. However, when the distribution resistors 130 and 150 are located only between the switches 140 and 160 and the ground as described above, there is concern that the switches 140 and 160 would not be protected from external surges, which may shorten the lifespan of the apparatus. Accordingly, it is preferable in terms of the lifespan extension of the apparatus to arrange a first protective resistor 170 connected to the positive terminal of the battery 10 and the first switch 140 and a second protective resistor 180 connected to the negative terminal of the battery 10 and the second switch 160, thereby protecting the switches 140 and 160 from external surges.

FIG. 1 illustrates that the first protective resistor 170 is disposed between the positive terminal of the battery 10 and the first switch 140, but the first protective resistor 170 may be disposed between the first switch 140 and the first distribution resistor 130. Alternatively, the first protective resistor 170 may be disposed both between the positive terminal of battery 10 and the first switch 140 and between the first switch. 140 and the first distribution resistor 130. Likewise, although FIG. 1 illustrates that the second protective resistor 180 is disposed between the negative terminal of the battery 10 and the second switch 160, the second protective resistor 180 may be disposed between the second switch 160 and the second distribution resistor 150. Alternatively, the second protective resistor 180 may be disposed both between the negative terminal of the battery 10 and the second switch 160 and between the second switch 160 and the second distribution resistor 150.

In addition, when the insulation resistance measurement unit 200 measures the second voltage applied to the second distribution resistor 150, in order to adjust a range of the second voltage, more specifically, to obtain a value of the second voltage other than Zero (0), it is preferable to arrange a direct current voltage source 190 connected to the second distribution resistor 150 and the ground. Here, a voltage value of the direct current voltage source 190 may be positive (+) or negative (−).

FIG. 2 is a diagram schematically illustrating a case in which a dielectric breakdown occurs at the positive electrode of the battery in FIG. 1.

As illustrated in FIG. 2, when the dielectric breakdown occurs at the positive electrode of the battery 10, the positive electrode insulation resistor 110 between the positive terminal of the battery 10 and the ground has a specific value rather than an infinite value. Accordingly, in order to check whether or not a dielectric breakdown occurs at the positive electrode of the battery 10, the insulation resistance measurement unit 200 operates the first switch 140 in a to turn-off state and the second switch 160 in a turn-on state.

When the resistance value of the positive electrode insulation resistor 110 of the battery 10 is measured, the insulation resistance measurement unit 200 assumes the negative electrode insulation resistor of the battery 10 to have an infinite resistance value. If the negative electrode insulation resistor is assumed to have an infinite resistance value, the insulation resistance measurement unit 200 may measure the resistance value of the positive electrode insulation resistor 110 of the battery 10 by merely measuring only one, i.e. the second voltage, not through simultaneous equations, as will be described below, thereby enabling rapid measurement.

When the first switch 140 is operated in the turn-off state and the second switch 160 is operated in the turn-on state, a current path is formed in such a manner as to be connected to the positive terminal of the battery 10, the positive electrode insulation resistor 110, the ground, the second distribution resistor 150, the second protective resistor 180, and the negative terminal of the battery 10.

When a current I2 flows through the current path formed at the time of the dielectric breakdown at the positive electrode of the battery 10, the current I2 is represented by the following Equation 1.

$$I2 = \frac{Vb - Vdc}{Riso1 + R2 + Ron2} \quad \text{[Equation 1]}$$

In Equation 1, Vb denotes a voltage of the battery 10, Vdc denotes a voltage of the direct current voltage source 190, Riso1 denotes the resistance value of the positive electrode insulation resistor 110 of battery, R2 denotes a resistance value of the second distribution resistor 150, and Ron2 denotes a resistance value of the second protective resistor 180.

If the current I2 is as shown in Equation 1, the second voltage V2 applied to the second distribution resistor 150 is represented by the following Equation 2.

$$V2 = I2 \times R2 = \frac{R2}{Riso1 + R2 + Ron2}(Vb - Vdc) \quad \text{[Equation 2]}$$

When Equation 2 is solved with respect to Riso1, then the following Equation 3 is obtained.

$$Riso1 = \left(\frac{Vb - Vdc}{V2}\right)R2 - (R2 + Ron2) \quad \text{[Equation 3]}$$

The insulation resistance measurement unit 200 may include a memory on which a voltage of the battery 10, a voltage of the direct current voltage source 190, a resistance value the second distribution resistor 150, and a resistance value of the second protection resistor 180 are stored. Accordingly, insulation resistance measurement unit 200 may measure the resistance value of the positive electrode insulation resistor 110 by merely measuring the second voltage applied to the second distribution resistor 150.

Figure 3:
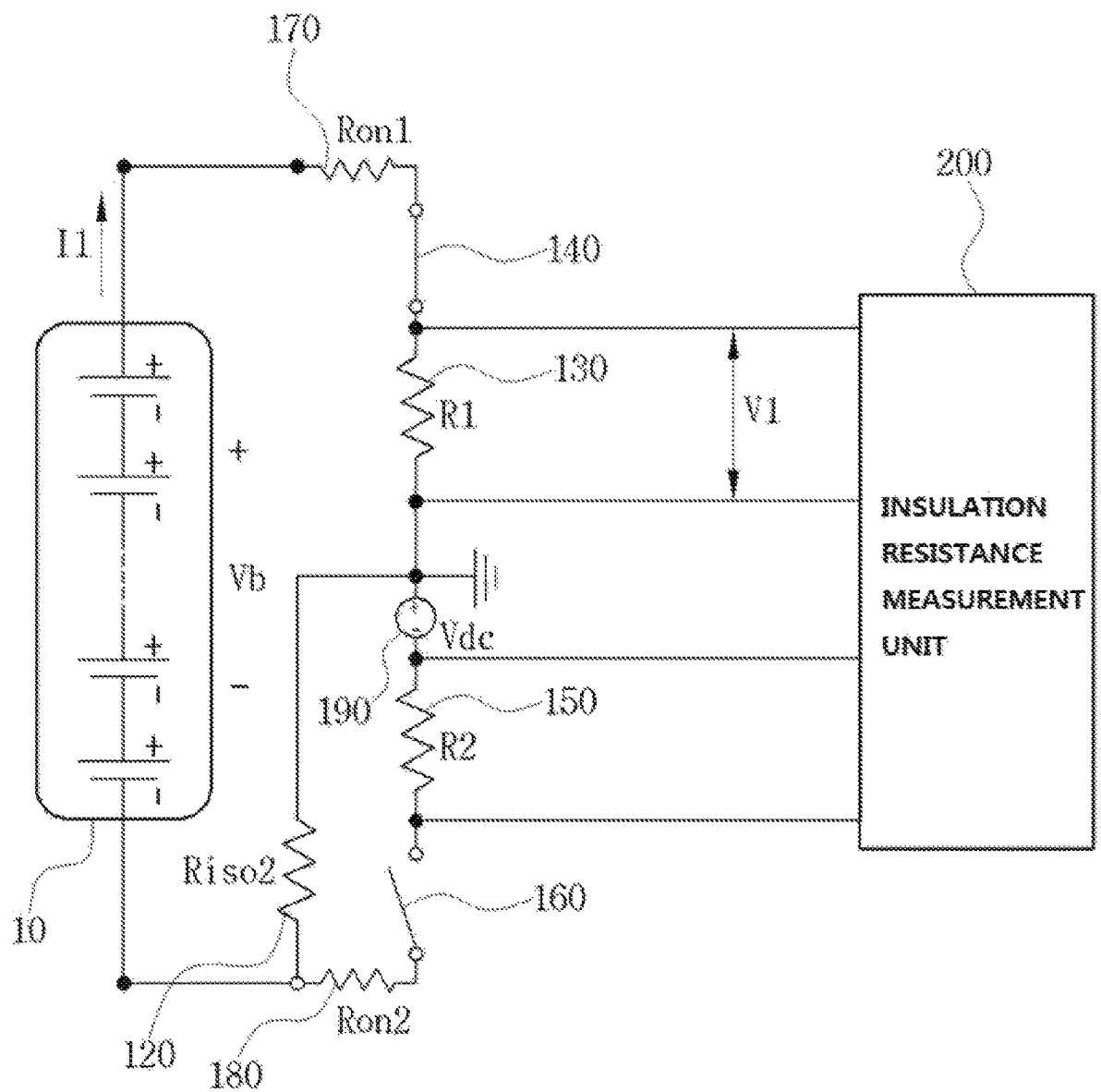
FIG. 3 is a diagram schematically illustrating a case in which a dielectric breakdown occurs at a negative electrode of the battery in FIG. 1.

FIG. 3 is a diagram schematically illustrating a case in which a dielectric breakdown occurs at the negative electrode of the battery in FIG. 1.

As illustrated in FIG. 3, when the dielectric breakdown occurs at the negative electrode of the battery 10, the negative electrode insulation resistor 120 between the negative terminal of the battery 10 and the ground has specific value rather than an infinite value. Accordingly, in order to check whether or not a dielectric breakdown occurs at the negative electrode of the battery 10, the insulation resistance measurement unit 200 operates the first switch 140 in a turn-on state and the second switch 160 in a turn-off state.

When the resistance value of the negative electrode insulation resistor 120 of the battery 10 is measured, the insulation resistance measurement unit 200 assumes the positive electrode insulation resistor of the battery 10 to have an infinite resistance value. If the positive electrode insulation resistor is assumed to have an infinite resistance value, the insulation resistance measurement unit 200 may measure the resistance value of the positive electrode insulation resistor 120 of the battery 10 by merely measuring only one, i.e. the first voltage, not through simultaneous equations, as will be described below, thereby enabling rapid measurement.

When the first switch 140 is operated in the turn-on state and the second switch 160 is operated in the turn-off state, a current path is formed in such a manner as to be connected to the positive terminal of the battery 10, the first protective resistor 170, the first distribution resistor 130, the ground, the negative electrode insulation resistor 120, and the negative terminal of the battery 10.

When a current I1 flows through the current path formed at the time of the dielectric breakdown at the negative electrode of the battery 10, the current I1 is represented by the following Equation 4.

$$I1 = \frac{Vb}{Ron1 + R1 + Riso2}$$ [Equation 4]

In Equation 4, Vb denotes a voltage of the battery 10, Ron1 denotes a resistance value of the first protective resistor 170, R1 denotes a resistance value of the first distribution resistor 130, and Riso2 denotes a resistance value of the negative electrode insulation resistor 120 of the battery.

If the current I1 is as shown in Equation 4, the first voltage V1 applied to the first distribution resistor 130 is represented by the following Equation 5.

$$V1 = I1 \times R1 = \frac{R1}{Ron1 + R1 + Riso2} Vb$$ [Equation 5]

When Equation 5 is solved with respect to Riso2, then the following Equation 6 is obtained.

$$Riso2 = \frac{Vb}{V1} R1 - (R1 + Ron1)$$ [Equation 6]

The insulation resistance measurement unit 200 may include a memory on which a voltage of the battery 10, a resistance value of the first distribution resistor 130, and a resistance value of the first protective resistor 170 are stored. Accordingly, the insulation resistance measurement unit 200 may measure the resistance value of the negative electrode insulation resistor 120 by merely measuring the first voltage applied to the first distribution resistor 130.

As described above, the apparatus for measuring an insulation resistance according to an exemplary embodiment of the present invention excludes an intervening component such as an operational amplifier or a test circuit, so that the apparatus can be simplified and the price of the apparatus can be reduced, and the insulation resistance measurement rate can be improved. In addition, when a resistance value of the positive electrode insulation resistor 110 of the battery 10 is measured, it is assumed that the negative electrode insulation resistor of the battery 10 has an infinite resistance value, and when a resistance value of the negative electrode insulation resistor 120 of the battery 10 is measured, it is assumed that the positive electrode insulation resistor of the battery 10 has an infinite resistance value, thereby further improving the insulation resistance measurement rate.

According to the present invention, it is possible to not only simplify the apparatus for measuring an insulation resistance of a battery and reduce the price of the apparatus but also improve an insulation resistance measurement rate by excluding an intervening component such as an operational amplifier or a test circuit.

In addition, it is possible to protect the switches from external surges by placing the first protective resistor connected to the positive terminal of the battery and the first switch and the second protective resistor connected to the negative terminal of the battery and the second switch. Accordingly, it is possible to extend the life of the apparatus.

Although the present invention has been described with reference to the specific exemplary embodiments and the accompanying drawings, the present invention is not limited to the above-described exemplary embodiments but may be variously modified and changed from the above description by those skilled in the art to which the present invention pertains. Therefore, the spirit the present invention should be understood only by the follow mg claims, and all of the equivalences or equivalent modifications to the claims are intended to fall within the scope of the technical idea of the present invention.

What is claimed is:

1. An apparatus for measuring an insulation resistance, comprising:
   a first distribution resistor connected to a positive terminal of a battery and a ground;
   a first switch connected to the positive terminal of the battery and the first distribution resistor;
   a second distribution resistor connected to a negative terminal of the battery and the ground;
   a second switch connected to the negative terminal of the battery and the second distribution resistor; and
   an insulation resistance measurement unit measuring a resistance value of a negative electrode insulation resistor of the battery using a first voltage applied to the first distribution resistor and measuring a resistance value of a positive electrode insulation resistor of the battery using a second voltage applied to the second distribution resistor,
   wherein when the resistance value of the positive electrode insulation resistor of the battery is measured, the insulation resistance measurement unit assumes the negative electrode insulation resistor of the battery to have an infinite resistance value, and
   when the resistance value of the negative electrode insulation resistor of the battery is measured, the insulation resistance measurement unit assumes the positive electrode insulation resistor of the battery to have an infinite resistance value.

2. The apparatus for measuring an insulation resistance of claim 1, wherein the insulation resistance measurement unit is connected directly to the first distribution resistor and the second distribution resistor to measure the first voltage and the second voltage.

3. The apparatus for measuring an insulation resistance of claim 1, wherein the insulation resistance measurement unit controls the first switch and the second switch to be turned on or off to create a current path connected to the positive terminal of the battery, the ground, and the negative terminal of the battery.

4. The apparatus for measuring an insulation resistance of claim 1, wherein when the resistance value of the positive electrode insulation resistor of the battery is measured, the insulation resistance measurement unit operates the first switch in a turn-off state and the second switch in a turn-on state, and
   when the resistance value of the negative electrode insulation resistor of the battery is measured, the insulation resistance measurement unit operates the first switch in a turn-on state and the second switch in a turn-off state.

5. The apparatus for measuring an insulation resistance of claim 1, further comprising:
a first protective resistor connected to the positive terminal of the battery and the first switch; and
a second protective resistor connected to the negative terminal of the battery and the second switch.

6. The apparatus for measuring an insulation resistance of claim 5, further comprising a direct current voltage source connected to the second distribution resistor and the ground.

7. The apparatus for measuring an insulation resistance of claim 6, wherein the insulation resistance measurement unit measures the resistance value of the positive electrode insulation resistor of the battery through the following Equation 1:

$$Riso1 = \left(\frac{Vb - Vdc}{V2}\right)R2 - (R2 + Ron2) \qquad \text{[Equation 1]}$$

where Riso1 is the resistance value of the positive electrode insulation resistor of the battery, Vb is a voltage of the battery, Vdc is a voltage of the direct current voltage source, V2 is the second voltage applied to the second distribution resistor, R2 is a resistance value of the second distribution resistor, and Ron2 is a resistance value of the second protective resistor.

8. The apparatus for measuring an insulation resistance of claim 6, wherein the insulation resistance measurement unit measures the resistance value of the negative electrode insulation resistor of the battery through the following Equation 2:

$$Riso2 = \frac{Vb}{V1}R1 - (R1 + Ron1) \qquad \text{[Equation 2]}$$

where Riso2 is the resistance value of the negative electrode insulation resistor of the battery, Vb is a voltage of the battery, V1 is the first voltage applied to the first distribution resistor, R1 is a resistance value of the first distribution resistor, and Ron1 is a resistance value of the first protective resistor.

* * * * *